(12) United States Patent
Keller

(10) Patent No.: US 6,196,594 B1
(45) Date of Patent: Mar. 6, 2001

(54) METHOD AND APPARATUS FOR CREDIT CARD MAINTENANCE

(75) Inventor: John A. Keller, Sea Isle, NJ (US)

(73) Assignee: John A. Keller, Sr., Sea Isle City, NJ (US)

( * ) Notice: Subject to any disclaimer, the term of this patent is extended or adjusted under 35 U.S.C. 154(b) by 0 days.

(21) Appl. No.: 08/725,429

(22) Filed: Oct. 3, 1996

Related U.S. Application Data

(63) Continuation-in-part of application No. 08/587,335, filed on Jan. 16, 1996, now Pat. No. 5,700,037.

(51) Int. Cl.[7] .................................................. B42D 15/00

(52) U.S. Cl. ............................. 283/82; 283/82; 283/904

(58) Field of Search ..................................... 283/107, 101, 283/82, 83, 99, 904; 156/230, 238, 303.1

(56) References Cited

U.S. PATENT DOCUMENTS 5,700,037 * 12/1997 Keller .................................. 283/107

* cited by examiner

Primary Examiner—Willmon Fridie, Jr.

(57) ABSTRACT

An apparatus for replacing a data carrier on a card is provided. A tape has a length, lengthwise edges, a width, a leading edge, a trailing edge, a front face and a rear face. A replacement data carrier is permanently mounted to the front face at a predetermined position with respect to the lengthwise edges. An adhesive material is located on the front face which adhesive is adapted to bond with a surface of the card.

A system and method for mounting a data carrier to a card are also provided. A means is provided for supplying a tape. The data carrier is permanently mounted to the front face at a predetermined position on the tape. A means is provided for positioning a card in a selected relationship to the tape such that the data carrier is aligned with the rear face of the card. A means is provided for fixing the tape permanently to the rear face of the card. A means is provided for delivering the card from the fixing means to a cardholder.

28 Claims, 2 Drawing Sheets

METHOD AND APPARATUS FOR CREDIT CARD MAINTENANCE

CROSS REFERENCE TO RELATED APPLICATION

This application is a continuation-in-part of SECURITY IMPROVED CARD, Ser. No. 08/587,335, filed Jan. 16, 1996, U.S. Pat. No. 5,700,037, issued Dec. 23, 1997.

BACKGROUND OF THE INVENTION

This invention is related to the field of electronic data carriers and electronic components. More particularly, the invention is directed to an electronic component which can be applied at a remote location by a user and a method of applying the component. Aspects of the invention are directed to an attachable strip for magnetic strip cards and a method of replacing or applying the strips at a location remote from the card issuer.

Electronic components have been made smaller, lighter and more effective over recent years. For example, computer chips, data carrying magnetic strips and solar power cells are able to be applied to carriers (such as cards) which fit into a wallet. Such electronic components can carry large amounts of data and serve numerous other purposes, depending on the particular component.

Cards bearing an electronic data carrier of some sort are currently used for numerous purposes. For example, the use of credit and debit cards is commonplace among persons involved in all types of financial transactions. Further, such cards are used to open electronic locks, as rail passes, library cards, for parking lot access, medical identification cards and so on. All of these cards have or can have a common size and thickness and all contain an electronic component, such as a computer chip or a magnetic strip imprint bearing ferrous metal particles (or both), which is capable of being encoded with information. The information on some electronic components is changed as the card is used. The magnetic strips in present use may include a plurality of tracks and may be positioned anywhere on the card (in a fixed spatial relationship to an edge) that is not reserved for the raised letters of the owner's name, card number and other indicia.

Credit cards are issued providing each card with a specific identification number assigned to the card owner. The card can be visually identified by the number, the name of the card owner, and other information (such as expiration date, the date of joining the credit plan, and the like). Smart cards include a computer chip mounted in or on the card. The chip contains information about the owner of the card, account balances, passwords and the like. Due to the large amount of information on these smart carts they can be employed for numerous purposes. Debit cards are issued by banks to allow charging directly to a checking account or a savings account in the institution. Automatic Teller Machine cards, a type of debit card, are used to withdraw cash from the bank using electronic tellers. Newer "money cards" are issued with no value until moneys are paid by the card owner to the issuer of the card at which time the electronic code on the card is changed to reflect the balance of purchasing power up to that limit, such as, for telephone calls and the like. At each purchase, that amount is reduced until the amount originally paid has been dissipated. Entry or pass cards are used in hotels and high security buildings in place of keys. Expansion of the use of the entry cards in residential buildings and motor vehicles is likely. Of course, there are many other uses for such data carrying cards.

Despite the proliferation of these cards, a number of handling and security problems exist. Although the card almost always includes raised letters and numbers to identify the owner, the card number and the expiration date, most uses of the cards employ electronic readers which directly read information from the electronic component, rather than the physical indicia on the card. However, the information coded on the electronic component can be damaged if the electronic component comes into proximity with a magnetically charged body. Further, if the credit card is merely kept in a person's pocket, it is subjected to continued abrasion, moisture, bending, flexing and possible damage to the electronic component. Since this is typically not discovered until the card is being used, it is not uncommon for the card to be rendered useless to the owner at a most inopportune and embarrassing time.

When the electronic component on a card has been damaged, the entire card is routinely replaced. Typically, the cardholder is asked by the card issuer to destroy the card and is issued a temporary card. A replacement card must be manufactured, embossing letters on the card and coding a new magnetic strip and then delivered to the cardholder. This procedure is costly and time consuming and can take a few days for the cardholder to get his replacement card. For certain cards (such as the money cards), this may result in an irreversible financial loss to the cardholder.

Despite the common use of such electronic components on cards, many other uses are not fully exploited. The electronic components are applied to cards and encoded at a plant of the card issuer. Such electronic components are not applied at remote locations, either to cards or other objects, and not under the computer control of the component issuer at these remote locations. Further, such cards typically have only a single electronic component and, thus, perform only a single function. Due to the expense of manufacture, these cards typically are not manufactured and encoded for a single or limited use, such as for event tickets.

Various patents describe methods and apparatus for forming the cards or apply the magnetic strip. See, e.g., U.S. Pat. Nos. 4,044,231; 4,100,011; 4,231,828 and 4,544,184. None of these devices address the problems and needs described above nor do they attain the objects of the invention described herein below.

SUMMARY OF INVENTION

Throughout the Specification and Claims the term "card" is intended to refer to any card that bears an electronic component, such as a magnetic strip or chip for data storage, and includes credit cards, debit cards, and money cards, as well as pass or entry cards to buildings, rooms, automobiles, medical services and the like, including personal ID cards or event tickets. Further, items having similar thickness but a different, non-rectangular profile are also considered cards.

It is an object of the invention to provide an electronic component that can be applied by a person to an object, such as a card, at a location remote to the manufacture of the electronic component.

It is a further object of the invention to provide a method of applying an electronic component to an object at a location remote to the manufacture of the electronic component.

It is a further object of the invention to provide a replaceable or additional data carrier which can be placed on a previously-issued card and serve as the originally issued data carrier.

It is a further object of the invention to provide a data carrier which can be replaced on an issued card at a location remote from the card issuer.

It is a further object of the invention to provide a method of revitalizing a card at an on-site location by replacing a magnetic strip or computer chip, or by re-encoding the magnetic strip or the computer chip.

It is a further object of the invention to provide means for applying a data carrier on a card on site when a previous data carrier has been damaged or needs updating.

It is a further object of the invention to provide an apparatus and method for applying additional electronic components to existing cards, thereby giving the card additional functionality.

In accord with one aspect of the invention, an apparatus for applying an electronic component to an object is provided. A tape has a length, lengthwise edges, a width, a leading edge, a trailing edge, a front face and a rear face. An electronic component is mounted to the front face at a predetermined position with respect to at least one edge. An adhesive material is located on the front face which adhesive is adapted to bond with a surface of the object. A release paper is removably positioned on the front face over the adhesive material.

Certain implementations of this aspect of the invention provided that: the electronic component is permanently mounted to the tape; the surface area of the tape is substantially larger than the surface area of the electronic component; the adhesive material is cured to the card with heat; the adhesive material is cured to the card with ultraviolet light; the adhesive material is cured to the card with pressure; the tape is color coded; the electronic component is clear; the electronic component is a magnetic strip and the object is a card; the electronic component is a computer chip and the object is a card; the electronic component is a first data carrier and further comprising a second data carrier on the tape between the leading edge and the trailing edge.

In accord with another aspect of the invention, a system for mounting an electronic component to a card is provided. The card has a front surface and a rear surface. A means is provided for supplying a tape to a desired location, the tape having a length, a lengthwise edge, a width, a leading edge, a trailing edge, a front face and a rear face wherein the electronic component is mounted to the front face at a predetermined position with respect to at least one edge. A means is provided for positioning the card in a selected relationship to the tape at the desired location such that the electronic component is aligned with the rear surface of the card. A means is provided for fixing the tape to the rear surface of the card. A means is provided for delivering the card from the fixing means to a cardholder.

Certain implementations of this aspect of the invention provide that: the electronic component is permanently mounted to the tape and wherein the means for fixing the tape comprises a means for permanently fixing the tape to the rear surface of the card; the means for fixing the tape to the card includes an adhesive material disposed on one face of the tape; a means is provided for curing the adhesive; the card contains a previous electronic component and further comprising a means for deleting the information on the previous electronic component; the electronic component is a data carrier; the tape has a substantially greater surface area than the data carrier; a means for coding the data carrier; the coding means is operably engaged to a card issuer's computer; a means is provided for cleansing the card before the fixing of the tape.

In accord with another aspect of the invention, a method of permanently applying a data carrier to a card is provided. A card is received from a cardholder. A tape is supplied to a desired location, the tape having a length, lengthwise edges, a width, a leading edge, a trailing edge, a front face and a rear face wherein a data carrier is permanently mounted to the rear face at a predetermined position. The card is delivered to the desired location such that the data carrier is at a selected position on the card. The tape is adhered to the card. The data carrier is encoded. The encoded card to the cardholder.

Certain implementations of this aspect of the invention provide that: adhering the tape to the card includes pressing the card against the tape and curing an adhesive disposed between the card and the tape; the card contains a previous data carrier and further comprising decoding the previous data carrier; a second data carrier is mounted to the tape at the same lengthwise position as the data carrier.

In accord with another aspect of the invention, an apparatus is provided for applying an electronic component to a card. A substantially rigid sheet having a first side and a second side is provided. A hinge is positioned on the sheet between the first side and the second side. A tape is disposed on the first side of the rigid sheet. At least one electronic component is mounted to a face of the tape. An adhesive material is mounted to the face of the tape. A means for positioning the card on the second side is provided such that, as the first side and second side are brought together, the tape contacts the card.

Certain implementations of this aspect of the invention provide that: the hinge is a depression in the rigid sheet; the card positioning means comprises slits disposed in the second side; the positioning means comprises a graphic on the second side; the electronic component is permanently mounted to the tape; the electronic component has an exposed surface distal to the tape and wherein adhesive is applied to the exposed surface.

In accord with another aspect of the invention, an apparatus is disclosed for providing electronic components having encoded data to be applied to objects. A sheet has a front side, a rear side and a top. At least one tape having a length, lengthwise edges, a width, a leading edge, a trailing edge, a front face and a rear face is removably mounted to the front side of the sheet. An electronic component is mounted to the front face at a predetermined position with respect to at least one edge. An adhesive material is located on the front face which adhesive is adapted to bond with a surface of the object.

Certain implementations of this aspect of the invention provide that: a release paper is removably positioned on the front face over the adhesive material; a graphic is disposed at the top of the sheet; at least a second tape having an electronic component is mounted to the rear side of the sheet.

In accord with another aspect of the invention, a carrier for an electronic component is provided. A member has a first surface and a second surface. An electronic component is mounted to the first surface. A ridge is disposed on the member proximate the electronic component.

Certain implementations of this aspect of the invention provide that: the ridge comprises a channel disposed in the member and protruding out of the second side; the electronic component has a profile and the ridge has profile similar to the electronic component; the ridge is a first ridge and further comprising a second ridge formed in the member, distinct from the first ridge and proximate to the electronic component; the ridge is formed by a die; the member is a card, the electronic carrier is a computer chip and the ridge is a bump formed in the second side by a cavity formed in the first side.

In accord with another aspect of the invention, a method of revitalizing a card having an electronic component at a location remote to the issuer of the electronic component is provided. The card had been previously encoded. The card is received from a cardholder at a location remote from the issuer of the electronic component. The issuer of an electronic component is contacted via a first electronic signal. A second electronic signal is received from the issuer of the component in response to the first electronic signal. The electronic component is re-encoded based, at least in part, on the second electronic signal. The card is returned to the cardholder.

Certain implementations of this aspect of the invention provide that: the method further comprises supplying a tape to a desired location, the tape having a length, lengthwise edges, a width, a leading edge, a trailing edge, a front face and a rear face wherein a data carrier is permanently mounted to the rear face at a predetermined position, delivering the card to the desired location such that the data carrier is at a selected position on the card, adhering the tape to the card, and encoding the data carrier based at least in part on the second signal; the data carrier is encoded with information identifying the cardholder.

DESCRIPTION OF PREFERRED EMBODIMENTS

Figure 1:
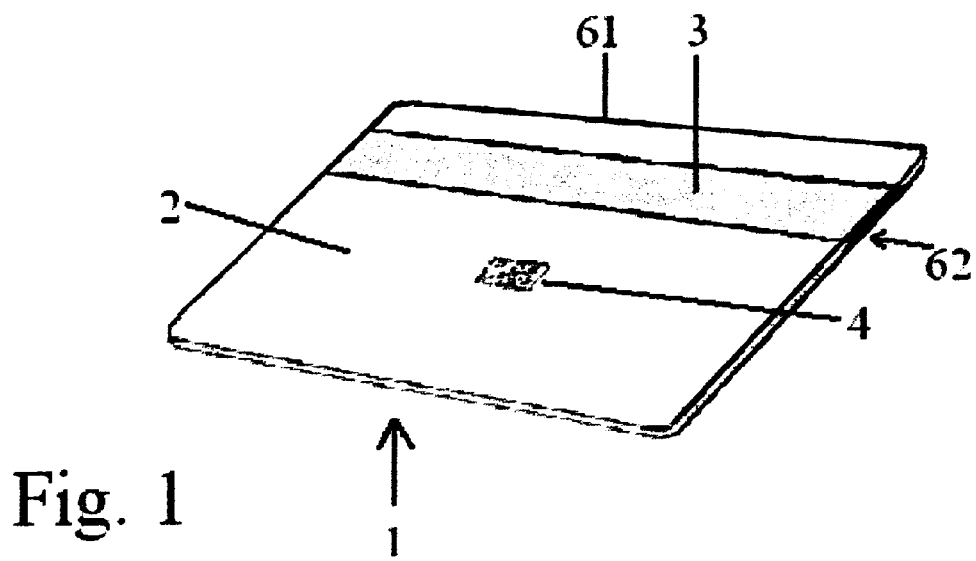
FIG. 1 is a rear elevation view of a card for use with this invention.

One aspect of the current invention is intended for use with plastic cards 1 having electronic components 200 (see FIG. 2), such as data carriers 3,4, on the rear surface 2 of the card, as seen in FIG. 1. The card may also be a folding card as disclosed in the parent of this application, Ser. No. 08/587,335, incorporated herein by reference. The card 1 is a rigid polyvinyl chloride sheet, made of thin colorless polymeric veneers, about thirty mils thick with a length of three and three eighths inches along edge 61 and a width of two and one eighth inches along edge 62.

The electronic components are at predetermined locations on the surface of the card. A thin magnetic strip 3 typically extends along the rear surface 2 of the card parallel to one edge of the card. Identifying information, such as the cardholder's name or the card issuer's logo, is located on the front surface of the card. Other such cards have an actual computer chip 4 on the card and an electromagnetic lead (or contact surface) which can be accessed by another computer, such as in an ATM and the like. Other electronic components, such as a solar power cell and the like, may also be employed and practice the invention.

Figure 2:
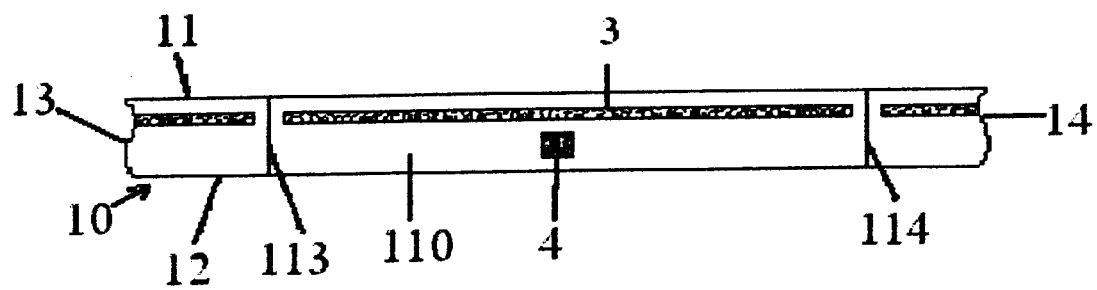
FIG. 2 is a rear elevation view of a tape bearing data carriers for use with this invention.
Figure 3:
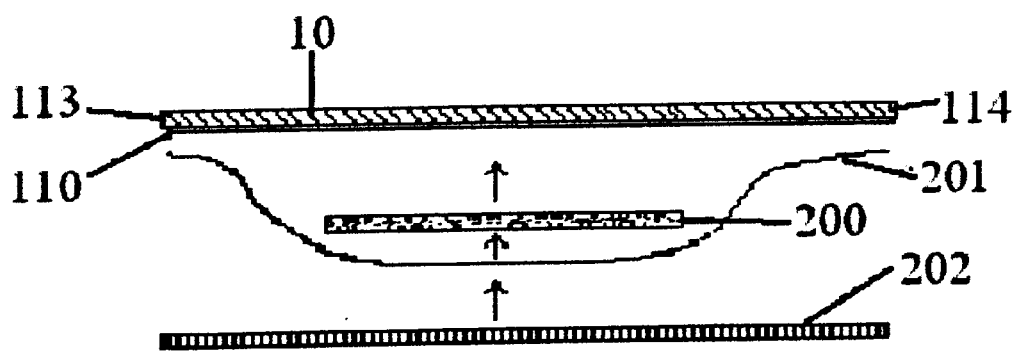
FIG. 3 is an exploded side view of an electronic component on a tape.

Referring to FIGS. 2 and 3, various data carriers 3,4 (or other electronic components 200) are permanently mounted to the front face of a tape 10. Typically, the electronic components are permanently mounted to the tape. However, in certain applications, it is advantageous to remove the tape and expose the electronic component. Consequently, the tape may be removably attached to the electronic component. The tape has a lead end 14, a trail end 13 and side edges 11,12. The tape is cut, creating a lead edge 114 and a trailing edge 113. The electronic components are located on the tape at a selected position. In particular, the electronic component is at a predetermined positioned with respect to at least one edge of the tape. The tape is preferably clear, however it may be colored for aesthetic purposes as a particular card designer prefers. Further, the electronic component may be colored or clear, as disclosed in U.S. Pat. No. 3,955,294, incorporated herein by reference. The tape may be made of any material which is compatible with the selected electronic component.

As shown, a magnetic strip 3 and a chip 4 are mounted to the tape at an overlapping lengthwise position along the tape 10 (i.e., both are positioned between leading edge 114 and the trailing edge 113 of a given portion of the tape). Typically, however, only a single electronic component would be attached to the tape at a given lengthwise position although various combinations of the same or different types of carriers could be employed if desired. Additional magnetic components may be applied to an existing card without destroying the current functionality of the card. In particular, numerous magnetic strips can be applied to the tape at a particular lengthwise position, each corresponding to different data, such that a given card can carry data for different banks or credit card accounts as well as act as a door key, rail pass, medical "dog tag" and the like. Further, a computer chip containing information identifying the cardholder, such as the photograph or finger print of the cardholder, may be applied to an existing card without disturbing the functionality of the card.

FIG. 3 is an exploded side view of an apparatus for applying an electronic component to an object. The electronic component 200 is affixed to the tape 10. The adhesive 201 is applied in a layer over the electronic component and the front face 110 of the tape. A release paper 202 is positioned over the adhesive material. Although the adhesive material has strong bonding properties, the release paper is non-porous, permitting its easy removal. The release paper may be die-cut near the ends of the tape to permit it to be peeled more easily. Alternatively, non-adhesive tabs can be attached to the ends of the release paper and the tape. The adhesive material should be selected such that it adheres to the card but does not affect the operation of the electronic component. Preferably, the adhesive is waterproof, preventing moisture from contacting the electronic component.

Preferably, the tape has a substantially greater surface area than the electronic component such that a sizable border is formed about the electronic component by the tape (see FIG. 2). When adhered to the card, the border will seal against the card, forming a moisture-proof barrier between the environment and the electronic component. The tape size is selected depending on the size of the electronic component, the size of the object to which it will be applied and the adhesion and moisture-proofing requirements of a particular application.

Figure 5:
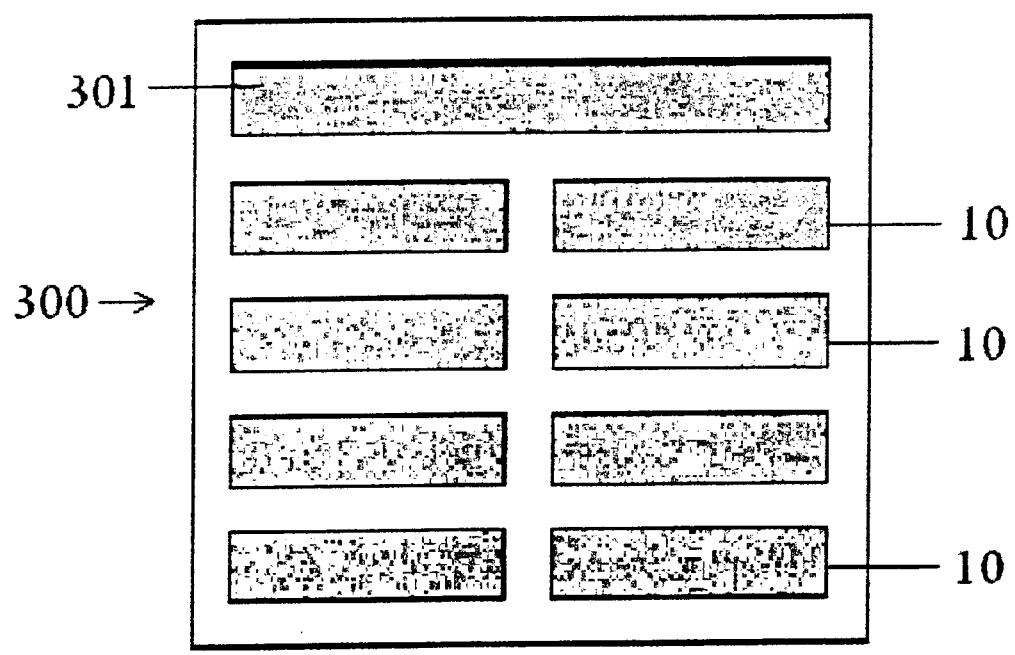
FIG. 5 is a front view of a sheet having removable tapes and electronic components in accord with an aspect of the invention.

The electronic components 200 mounted on cards 1 are often very delicate. Although the card is stiff, it will bend under sufficient stress. This bending may damage or destroy the electronic component on the card. A ridge 210 may be formed in the card near the region on which the electronic component is located (see FIGS. 5 and 6). As shown in FIG. 6, the ridge is preferably formed by a curved channel 211 in the front surface of the card and forms a protrusion on the rear surface 5. The ridge can extend along one or many sides of the component. Preferably, the ridge forms a profile in the card similar to the profile of the electronic component. Several ridges can be employed as the particular applications dictates. In particular, several rows of ridges matching the profile of the electronic component can be positioned on the card. Further, several sets of such ridges can be supplied if several electronic components are to be mounted to the card.

The ridge 210 may be formed as the letters are formed on the card. Further, the ridge may be formed with a heated die, a roller/track combination or by any other acceptable method. Further, the ridge could simply be a layer of added thickness on the card. Preferably, the ridge protrudes from the face of the card opposite the electronic component. Consequently, when a replacement or additional electronic component is provided, the tape does not need to ride over the ridge. The ridges also provide a target for the cardholder. When applying an electronic component, the ridges direct the cardholder where to position the electronic component.

Figure 4:
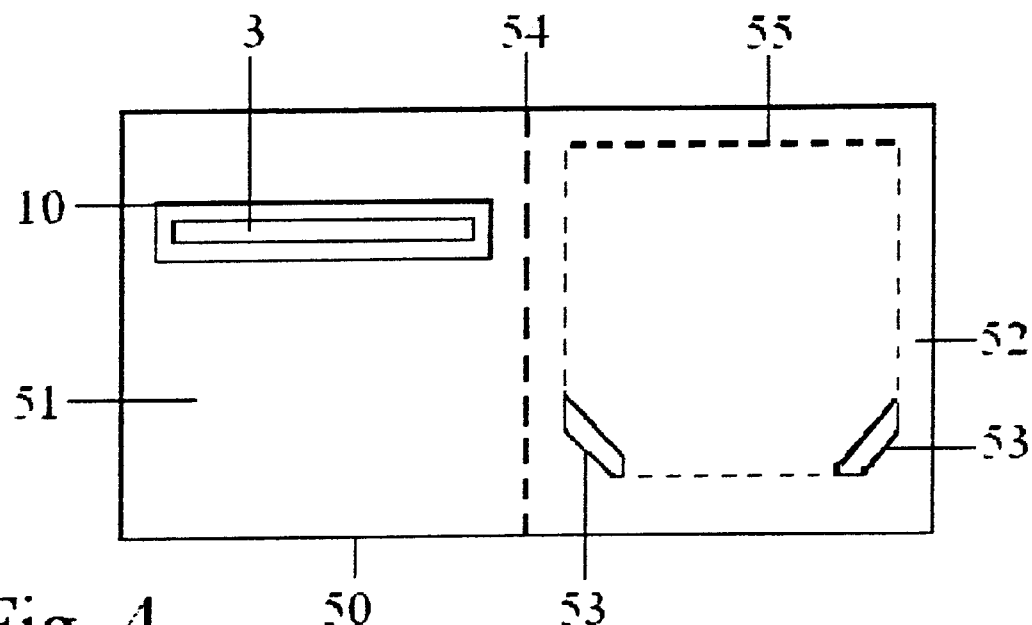
FIG. 4 is a rear elevation view of an applicator in accord with an aspect of the invention.

In one application of the invention, the tape 10 may be sent directly to the cardholder for application manually to a card. The cardholder is instructed where to align the tape and how to ensure good adhesion between the tape and the card. In one implementation, the tape may be supplied on an applicator 50 as shown in FIG. 4. The applicator is a substantially rigid sheet, preferably made of plastic, such as card stock, thick paper or cardboard. Other materials could also be employed. Instructions, logos and the like may be provided on the surface of the applicator.

The tape 10 is removably mounted to one side 51 of the applicator 50 at a fixed position. A weak adhesive can be employed between the tape and the applicator. Other methods of securing the tape in position can also be employed. A data carrier 3 (or other electronic component) is mounted to the tape on the side away from the applicator. A strong adhesive is located on the exposed surface. A slip, such as a nonporous release paper, may be positioned over the tape to prevent the adhesive from sticking before desired.

A means for locating the card is positioned on the other side 52 of the applicator. For example, slits 53 may be located in the applicator which receive the lower corners of the card, maintaining it in a fixed position. A graphic showing how the card should be positioned on the applicator may be applied to the applicator about the slits.

To operate the applicator 50, the cardholder physically cleans and dries the card, and runs a magnet along the strip currently on the card to blank it. The card is then inserted into the slits 53 such that it is at a predetermined position. The cardholder removes the non-porous release paper, exposing the adhesive. The cardholder then folds the applicator over about a hinge 54 such that the tape is brought into contact with the card. The hinge may be a perforation or indent in the rigid sheet, as well as various mechanical hinges. The cardholder then presses the sides of the closed applicator together, such that the adhesive bonds with the card, securing the tape to the card. The applicator is then opened and the card removed. When desirable, the tape may then be peeled off the electronic component, leaving the electronic component attached to the card and exposed (such as for electrical connection).

The tapes having the electronic components may also be distributed for application by hand at a remote location. A sheet 300 containing a group of tapes 10 is shown in FIG. 7. Electronic components are affixed to each tape. The sheet is a non-porous material, acting like a release paper. of course, a distinct release paper could also be employed. A graphic 301 may be supplied at the top of the sheet. The sheet can be covered with tape material and then die cut to form the individual tapes.

The electronic components may be encoded at the issuer's factory and then sent to the end user. For example, a lock manufacturer may supply a sheet of tapes with an electronic lock. The magnetic strips are pealed off the sheet and applied by hand to any card (or other like device of similar thickness) carried by an authorized person. This card can then be swiped through the electronic lock, actuating it. Other applications for this invention include coding the electronic component with user-identifying information. These strips can then be pealed off and applied to objects owned by the user (which need not be card-shaped). If the object was stolen, or mixed among other similar objects, it could easily be identified as belonging to the user by simply reading the identifying data on the electronic component. This is particularly useful when the magnetic strip is clear (as disclosed in U.S. Pat. No. 3,955,294) since it is less visible to the thief and less obtrusive to the object's owner.

In another application for the sheet 300 shown in FIG. 7, a card issuer can supply a cardholder with several attachable strips containing information appropriate for the given card. These strips can then be applied to various other cards in the cardholder's possession. Thus, any card can function as the card issuer's card. The strips can be color-coded or otherwise provided with indicia of the card issuer. Particularly, logos and the like can be applied to the tape in a non-metallic ink. Alternatively, the strip can also be clear. This would discourage any thief or subsequent possessor of the card from using it since it would be unknown what the strip was for or even if it was on the card. Further, the electronic components could be coded with medical information and the tapes applied to various cards held by the cardholder. In a medical emergency, at least one of these cards is likely to be on the cardholder.

Referring to FIG. 8, the current invention may be used at a various locations in which a self-contained, automated system would be advantageous such as banks, malls, airports and other accessible locations which are remote from the card issuer and the card issuers main computer. Further, the invention may be employed at an ATM or in another free standing machine at these locations. The system 100 shown in FIG. 8 can be of a small size, permitting convenient installation at many locations, and incorporation into existing ATM's. It must be kept in mind that the system shown in FIG. 8 is exemplary. Other systems may be employed and practice the invention.

The system 100 is enclosed in a cardholder station 101. The cover 102 of the station has a slot 103 for receiving the card 1 from the cardholder. Instructions for use may be printed on the cover. Sensors 104 are disposed near the slot to detect whether the card is oriented in the right direction, and that the card is the correct card. A conveyor 105 leads from the slot to the stamping station 25. As shown in FIG. 13, the conveyor includes a belt 31 which leads to an elevator 24. Other conveyors, such as rollers, slides, slots and the like may be employed to direct the card to stamping station at a selected orientation. A blanking mechanism 106 and a cleaning mechanism 107 may be located along the path from the slot to the stamping station.

Tape 10 is wound on a roll 20 and positioned on a roller 21. The roller is capable of free rotation, but may be driven if desired. The tape proceeds over a pair of driving rollers 23. The tape is guided by guide rollers 32 to the stamping station 25. Other guide means such as rollers, slots or belts may direct the tape, as a particular application requires and one skilled in the art would appreciate. The tape is delivered to a stamping station 25 with the front face 110 of the tape bearing the data carrier 3 at a predetermined position (shown facing down in FIG. 8).

As currently preferred, the adhesive material is applied to the tape 10 before it is rolled. In certain applications, the adhesive may be too strong to apply before rolling, or may only remain adhesive for a short period once exposed. Consequently, the adhesive may be applied as the tape enters the stamping station. A spray nozzle 70 may be positioned adjacent the tape surface 110. Adhesive material is sprayed from the nozzle onto the tape (and the data carrier, if desired) as the tape is fed into the stamping station. Alternatively, a roller or other mechanism can be used to apply the adhesive.

The stamping station 25 includes a press 26 which lowers onto the tape 10, pressing the tape onto the card 1. A cutter 27 is located at the end of the stamping station to cut the tape to an appropriate length for the card. Pressure rollers 33 are disposed downstream of the stamping station 25. Belts 28 or other conveyors are disposed downstream of the pressure rollers. A means 26 for curing the adhesive, such as an ultraviolet light, a heater or a pressure roller, and a coding mechanism 29 are disposed along the belt.

The coding mechanism 29 may be operably connected to the computer of the card issuer via telephone, ISDN link or other transmission means. Upon receipt of the card, a signal is transmitted by the station 100 to the issuer of the electronic component (in this case, the card issuer). The card issuer returns another signal to the station, providing any information necessary to encode the card properly for the particular cardholder. The coding mechanism then encodes the card based, at least in part, on the signal from the issuer of the electronic component.

Once a cardholder has discovered that the data carrier on his card has been damaged, he brings the card to the station 100. Typically, the station provides instructions to the cardholder regarding orienting the card properly. Sensors 104 located at the receiving point determine whether the card is inserted properly. if oriented improperly, or if the wrong card, the card is returned to the cardholder.

If oriented properly, the card is carried by belt 31, rollers or the like, and is delivered to the elevator 24 (at the position shown on phantom in FIG. 8). One skilled in the art would appreciate that various means of delivering the card can be employed and still practice the invention. The card is passed through the blanking mechanism 106 to erase any data stored currently on the data carrier. The card surface is prepared for bonding to the tape by the cleaning mechanism 107. The cleaning mechanism could be an electrostatic cleaner or the like. The elevator is raised, bring the card to the stamping station 25 at a selected orientation.

The tape 10 is pulled from the roll 20 by driving rollers 23 and directed to the stamping station 25 by guide rollers 32. The leading edge 114 of the tape is aligned with the edge of the card on the raised elevator 24. The press 26 is activated, pushing onto the elevator. The front surface 110 of the tape is thus caused to press against the card as the cutter 27 cuts the tape, forming trailing edge 113. As a result, the data carrier is located at a specific position on the rear face of the card. The tape covers the data carrier and at least a portion of the rear face. Preferably, the tape is the same length as the card.

Once the tape 10 is positioned on the card, it is passed through pressure rollers 33 to firmly bond the adhesive material. The card is then passed under the curing mechanism 126, to cure the adhesive material. Once the adhesive material is cured, the card is passed, by means of belts, rollers, slides or other conveyors, to the coding mechanism 29. Any coding device appropriate for the particular data carrier may be employed here. Preferably, the coding device is operably engaged to the computer of the card issuer such that information from the card issuer can be transmitted to the coding mechanism on site. The data carrier is then coded by the coding mechanism with appropriate data as may be dictated by the nature of the card and by the card issuer. Alternatively, in certain applications where user-specific information is not required, the data carriers may be encoded before rolling the tape. After the data carrier (and thus the card) is coded, it is conveyed back to the user by belts, rollers, slides or other conveyors.

In another implementation of the invention, the cardholder who has detected a damaged card inserts it into the station 100. The card is delivered to the coding mechanism 29 where it is re-encoded and returned to the cardholder. The card can be blanked at the blanking mechanism 106 before re-encoding if desired. If the card had simply been exposed to a strong magnetic field, or the like, the information on the electronic component would be destroyed but the electronic component would still be functional. Consequently, re-encoding the card should make it operable. If the card is still in operable, it can be assumed that the electronic component has been damaged. The card is then reinserted in to the station and a new electronic component is applied, as discussed above.

While this invention has been described with reference to specific embodiments disclosed herein, it is not confined to the details set forth and the patent is intended to include modifications and changes which may come within and extend from the following claims.

I claim:

1. An apparatus for applying an electronic component to an object comprising:

a. a tape having a length, lengthwise edges, a width, a leading edge, a trailing edge, a front face and a rear face;

b. an electronic component mounted to the front face at a predetermined position with respect to at least one edge;

c. an adhesive material located on the front face which adhesive is adapted to bond with a surface of the object; and d. a release paper removably positioned on the front face over the adhesive material.

2. The apparatus of claim 1 wherein the electronic component is permanently mounted to the tape.

3. The apparatus of claim 2 wherein the surface area of the tape is substantially larger than the surface area of the electronic component.

4. The apparatus of claim 2 wherein the adhesive material is cured to the card with heat.

5. The apparatus of claim 2 wherein the adhesive material is cured to the card with ultraviolet light.

6. The apparatus of claim 2 wherein the tape is color coded.

7. The apparatus of claim 1 wherein the electronic component is clear.

8. The apparatus of claim 1 wherein the electronic component is a magnetic strip and the object is a card.

9. The apparatus of claim 1 wherein the electronic component is a computer chip and the object is a card.

10. The apparatus of claim 1 wherein the electronic component is a first data carrier and further comprising a second data carrier on the tape between the leading edge and the trailing edge.

11. A system for mounting an electronic component to a card, which card has a front surface and a rear surface, the system comprising:

a. means for supplying a tape to a desired location, the tape having a length, a lengthwise edge, a width, a leading edge, a trailing edge, a front face and a rear face wherein the electronic component is mounted to the front face at a predetermined position with respect to at least one edge;

b. means for positioning the card in a selected relationship to the tape at the desired location such that the electronic component is aligned with the rear surface of the card;

c. means for fixing the tape to the rear surface of the card;

d. means for delivering the card from the fixing means to a cardholder; and e. means for decoding a previously applied electronic component.

12. A system for mounting an electronic component data carrier to a card, which card has a front surface and a rear surface, the system comprising:

a. means for supplying a tape to a desired location, the tape having a length, a lengthwise edge, a width, a leading edge, a trailing edge, a front face and a rear face wherein the electronic component is mounted to the front face at a predetermined position with respect to at least one edge;

b. means for positioning the card in a selected relationship to the tape at the desired location such that the electronic component is aligned with the rear surface of the card;

c. means for fixing the tape to the rear surface of the card;

d. means for delivering the card from the fixing means to a cardholder; and means for coding the data carrier wherein the coding means is operably engaged to a card issuer's computer.

13. A method of permanently applying a data carrier to a card comprising:

a. receiving a card from a cardholder;

b. supplying a tape to a desired location, the tape having a length, lengthwise edges, a width, a leading edge, a trailing edge, a front face and a rear face wherein a data carrier is permanently mounted to the rear face at a predetermined position;

c. delivering the card to the desired location such that the data carrier is at a selected position on the card;

d. adhering the tape to the card;

e. encoding the data carrier;

f. delivering the encoded card to the cardholder wherein adhering the tape to the card includes pressing the card against the tape and curing an adhesive disposed between the card and the tape.

14. The method of claim 13 wherein the card contains a previous data carrier and further comprising decoding the previous data carrier.

15. The method of claim 13 wherein a second data carrier is mounted to the *card at the same lengthwise position as the data carrier.

16. An apparatus for applying an electronic component to a card comprising:

a substantially rigid sheet having a first side and a second side;

a hinge positioned on the sheet between the first side and the second side;

a tape disposed on the first side of the rigid sheet;

at least one electronic component mounted to a face of the tape;

an adhesive mounted to the face of the tape; and a means for positioning the card on the second side such that, as the first side and second side are brought together, the tape contacts the card.

17. The apparatus of claim 16 wherein the hinge is a depression in the rigid sheet.

18. The apparatus of claim 16 wherein the card positioning means comprises slits disposed in the second side.

19. The apparatus of claim 16 wherein the positioning means comprises a graphic on the second side.

20. The apparatus of claim 16 wherein the electronic component is permanently mounted to the tape.

21. The apparatus of claim 16 wherein the electronic component has an exposed surface distal to the tape and wherein adhesive is applied to the exposed surface.

22. An apparatus for providing electronic components having encoded data to be applied to objects comprising:

a sheet having a front side, a rear side and a top;

at least one tape having a length, lengthwise edges, a width, a leading edge, a trailing edge, a front face and a rear face removably mounted to the front side of the sheet;

an electronic component mounted to the front face at a predetermined position with respect to at least one edge; and an adhesive material located on the front face which adhesive is adapted to bond with a surface of the object.

23. The apparatus of claim 22 further comprising a release paper removably positioned on the front face over the adhesive material.

24. The apparatus of claim 22 further comprising a graphic disposed at the top of the sheet.

25. The apparatus of claim 22 further comprising at least a second tape having an electronic component mounted to the rear side of the sheet.

26. A method of revitalizing a card having an electronic component at a location remote to the issuer of the electronic component, wherein the card had been previously encoded, the method comprising:

receiving the card from a cardholder at a location remote from the issuer of the electronic component;

contacting the issuer of an electronic component via a first electronic signal;

receiving a second electronic signal from the issuer of the component in response to the first electronic signal;

re-encoding the electronic component based, at least in part, on the second electronic signal; and returning the card to the cardholder.

27. The method of claim 26 further comprising:

supplying a tape to a desired location, the tape having a length, lengthwise edges, a width, a leading edge, a trailing edge, a front face and a rear face wherein a data carrier is permanently mounted to the rear face at a predetermined position;

delivering the card to the desired location such that the data carrier is at a selected position on the card;

adhering the tape to the card; and encoding the data carrier based at least in part on the second signal.

28. The method of claim 27 wherein the data carrier is encoded with information identifying the cardholder.

* * * * *